United States Patent
Turner

(10) Patent No.: US 7,345,428 B2
(45) Date of Patent: Mar. 18, 2008

(54) TRANSDUCER PACKAGE FOR PROCESS CONTROL

(76) Inventor: Terry R. Turner, 9505 Scenic Bluff, Austin, TX (US) 78733

( * ) Notice: Subject to any disclaimer, the term of this patent is extended or adjusted under 35 U.S.C. 154(b) by 978 days.

(21) Appl. No.: 10/668,398

(22) Filed: Sep. 23, 2003

(65) Prior Publication Data

US 2004/0253921 A1 Dec. 16, 2004

Related U.S. Application Data

(60) Provisional application No. 60/487,745, filed on Jul. 16, 2003, provisional application No. 60/486,983, filed on Jul. 14, 2003, provisional application No. 60/468,414, filed on May 6, 2003, provisional application No. 60/468,413, filed on May 6, 2003, provisional application No. 60/468,412, filed on May 6, 2003, provisional application No. 60/412,752, filed on Sep. 23, 2002.

(51) Int. Cl.
*H01J 7/24* (2006.01)

(52) U.S. Cl. .............................. 315/111.21; 118/723 I; 324/76.11

(58) Field of Classification Search ........... 315/111.21, 315/111.71; 324/76.11; 219/121.21, 121.41; 118/723 I, 723 IR; 455/2.01, 117
See application file for complete search history.

(56) References Cited

U.S. PATENT DOCUMENTS

| | | | |
|---|---|---|---|
| 4,263,653 A | 4/1981 | Mecklenburg | 702/60 |
| 4,562,413 A * | 12/1985 | Mishiro et al. | 331/116 R |
| 5,116,482 A * | 5/1992 | Setoyama et al. | 204/298.08 |
| 5,343,404 A | 8/1994 | Girgis | 702/72 |
| 5,565,737 A | 10/1996 | Keane | 315/111.21 |
| 5,587,630 A * | 12/1996 | Dooley | 315/209 T |
| 6,046,594 A | 4/2000 | Mavretic | 324/520 |
| 6,535,785 B2 * | 3/2003 | Johnson et al. | 700/121 |
| 6,791,274 B1 * | 9/2004 | Hauer et al. | 315/111.21 |

\* cited by examiner

*Primary Examiner*—Douglas W. Owens
*Assistant Examiner*—Jimmy Vu
(74) *Attorney, Agent, or Firm*—Hulsey IP Intellectual Property Lawyers PC

(57) ABSTRACT

A system (10) is provided herein for monitoring the harmonic content of the RF signal delivered to an RF powered device (13). The system comprises (a) a voltage transducer (16) adapted to sample the voltage of the RF signal and to output a first signal representative thereof, (b) a current transducer (17) adapted to sample the current of the RF signal and to output a second signal representative thereof, and (c) a memory device (67) in communication with at least one, and preferably both, of the aforementioned transducers 16 and 17 and which contains calibration information specific to the transducers.

16 Claims, 12 Drawing Sheets

TRANSDUCER PACKAGE FOR PROCESS CONTROL

CROSS REFERENCE TO RELATED APPLICATIONS

This application claims priority to U.S. Ser. No. 60,468,414, filed May 6, 2003, entitled "RF Sensor Voltage Transducer," U.S. Ser. No. 60/468,412, filed May 6, 2003, entitled "RF Detector for Semiconductor Processing," U.S. Ser. No. 60/468,413, filed May 6, 2003, entitled "RF Sensor Current Transducer," U.S. Ser. No. 60/486,983, filed Jul. 14, 2003, entitled "RF Power Sensor for Known Fixed Impedance Environments" U.S. Ser. No. 60/487,745, filed Jul. 16, 2003, entitled "An RF Delivery Diagnostic System," and U.S. Ser. No. 60/412,752, filed Sep. 23, 2002, entitled "RF Sensor for Process Control."

TECHNICAL FIELD OF THE INVENTION

The present invention relates generally to monitoring the harmonic content of delivered RF power, and more particularly, a system and method for monitoring the harmonic content of delivered RF power.

BACKGROUND OF THE INVENTION

Plasma etch and deposition processes have become the dominant pattern transfer means used in semiconductor manufacturing over the past 20 years. Most plasma based processes employ the fundamental principle of disassociation of a feed gas by the application of radio frequency (RF) power. As with all plasma loads, one of the dominant characteristics of the plasma load is its non-linearity. The non-linearity of the load affects the voltage and current sine waves of the delivered RF power by creating prevalent harmonic distortion. The exact amount of harmonic distortion, as represented by the amplitude of the harmonic frequencies and the associated phase angle of the current harmonic relative to the corresponding voltage harmonic, is unique to the plasma creating them. To be more precise, the plasma parameters, including ion and electron densities and energies, collision frequencies, neutral constituents, and their respective densities all contribute in a unique way to the amplitude of specific harmonic components of the fundamental frequency applied by a power delivery source to achieve the desired disassociation and subsequent process results.

It is thus apparent that, by monitoring the harmonic components of the fundamental frequency applied by a power delivery source, enhanced process control of plasma deposition and etch processes may be obtained. Consequently, several products have been developed that are designed to provide enhanced process control by monitoring such RF harmonic content. Unfortunately, wide scale proliferation of this technology has not been realized due to several fundamental limitations in the available technology.

One of the most significant limitations in the existing technology has to do with product architecture. Existing products typically contain a transducer package, commonly located at the point of measurement, and a corresponding analysis, control and communications package, which is typically located remotely from the point of measurement. Since each transducer package provides a unique output, these two packages are specifically calibrated to work with each other. Consequently, it is not possible to replace either package independently of the other without recalibrating the system. Since downtime is extremely expensive in a semiconductor processing line, this deficiency creates fatal maintenance and support issues for users of these RF sensor based process control solutions.

Although several devices are known for monitoring the harmonic content of delivered RF power, each requires precise calibration of individual components. Original hardware designed for plasma process control RF sensors in existing solutions has been based on either: a) RF switch routed band pass filters; (b) directional couplers; or (c) heterodyne or digital signal processor circuitry enabled with programmable local oscillators. Each of these designs comprises a transducer package with corresponding analysis and communications electronics package. In each case, the design is not capable of having a replacement substituted for either component package without the necessity to recalibrate the entire RF sensor device (consisting of both the transducer and the analysis/communication packages).

Consequently, a need exists in the art for methods and devices that will support a field replacement strategy that allows any transducer package to function properly with any corresponding analysis and communications package, without degradation in performance and without the need for recalibration.

Another issue with existing devices for monitoring the harmonic content of delivered RF power has to do with self-bias voltage. The RF power in plasma etch reactors is typically delivered to a capacitively coupled electrode. The capacitive coupling halts the flow of DC current in the direction of the RF power delivery network creating a "self-bias" voltage on the electrode surface. This "self-bias" voltage is always negative and may aid in the etch process by accelerating plasma ions in the direction of the substrate surface, thus providing much needed activation energy for the volatilization or polymerization process.

In light of its beneficial effects, it is desirable to know the self-bias voltage of a system, along with the components of the delivered RF power. However, although several voltage sampling schemes have been proposed in the art for monitoring the harmonic content of delivered RF power, to date, none of these schemes also allow the self-bias voltage to be monitored. U.S. Pat. No. 5,867,020 (Moore et al.), which discloses a commonly used capacitively coupled RF voltage probe, is exemplary. There is thus a need in the art for a method for monitoring the harmonic content of delivered RF power in a way that also allows the self-bias voltage to be monitored.

A further issue with existing devices for monitoring the harmonic content of delivered RF power concerns the shielding of the inductive transducer. Due to the pressure-flow regime and the molecular stability of many gases used in semiconductor processing, often a relatively high RF voltage is required to initialize and sustain the process plasma. In addition, the diode-like characteristics of plasmas can cause the RF current flow after ignition to be very high. The RF power is typically delivered to a capacitively coupled electrode where the flow of DC current is blocked, thus resulting in the DC "self-bias" voltage. Consequently, there is no need for a DC coupled RF current transducer to monitor the current component of the delivered RF power. However, there is a vital need to protect the simple inductive monitoring device, which operates in accordance with Faraday's Law, from stray fields (both magnetic as well as electric) that can significantly impact the potential for accurate RF current measurements.

Boundary condition analysis indicates that a grounded shield must be placed between the inductive transducer and the RF current carrier in order to properly shield the inductive transducer from the electric field radiating from the primary RF current carrier, and to thereby avoid crosstalk between voltage and current. Moreover, in order to shield the inductive transducer from stray electric and magnetic fields which may be in the ambient environment local to the measurement (such as the coil of an impedance matching network), the inductive transducer should be enclosed in a grounded shield. Unfortunately, the use of conventional shields to protect the transducer from ambient stray fields also impedes the measurement of the desired primary RF current magnetic field.

Various shield designs have been proposed in the art. However, none of these designs overcome the above noted infirmity. Thus, for example, U.S. Pat. No. 5,808,415 (Hopkins) and U.S. Pat. No. 6,061,006 (Hopkins) teach a dual loop antenna approach for monitoring RF current. U.S. Pat. No. 6,501,285 (Hopkins et al.) teaches an approach to assembling the inductor using individual printed circuit boards interconnected with metal filled vias to provide connection between the respective layers. U.S. Pat. No. 5,834,931 (Moore et al.) teaches a single turn first principles implementation of Faraday's law which, unfortunately, is limited by the propensity for arcing between the primary RF current carrier and the shield of the inductive loop.

There is thus a need in the art for a means to protect inductive monitoring devices which operate in accordance with Faraday's Law from stray fields (both magnetic as well as electric) that can significantly impact the potential for accurate RF current measurements. There is also a need in the art for such a device that does not impede the measurement of the desired primary RF current magnetic field.

A further issue related to the monitoring of the harmonic content of RF power sources concerns end point detection. Chemical vapor deposition (CVD) and plasma-enhanced chemical vapor deposition (PECVD) processes have become a vital component of semiconductor manufacturing over the past 20 years. CVD and PECVD processes are commonly used to deposit dielectric films at low temperatures to serve as either sacrificial layers or between metal layers as dielectric separation.

A non-value added, but essential, process step associated with both CVD and PECVD involves the plasma based cleaning of the chamber and associated components to remove residual film left after the deposition process. During the deposition process, the film is intentionally deposited on the semiconductor substrate. Chamber cleans are performed after the semiconductor substrate has been removed from the chamber, and as such, are critical to the success of the deposition process but are not actually a part of semiconductor device fabrication. The common means for chamber clean steps is plasma based volatilization of the deposited film.

A fundamental principle employed in most plasma based processes is disassociation of a feed gas by the application of radio frequency (RF) power. As a non-value added event, it is vital to minimize the duration of the chamber clean. Also, it has been documented that prolonged cleaning can actually degrade chamber components, thus resulting in the creation of yield limiting particles. Hence, in order to minimize manufacturing costs while maximizing step yields, it is imperative to know when to stop the clean process. The correct moment at which to halt the clean process is called end point.

RF end point detection is based on monitoring the components of the delivered RF power. As the film clears from the chamber components, the by-products of the volatilized film volumetrically decrease in the plasma. This volumetric change in the plasma components creates an impedance change seen by the RF power supply network, and results in consequential changes in the RF voltage, current, phase angle and self-bias voltage. By monitoring the changes in these signals, a correct determination of the RF end point may be obtained. Significantly, it is not necessary that the film type, film thickness or pattern density be consistent from run to run in order for the detector to properly function, since the signal analysis algorithm will be the compensating factor.

Various devices have been designed for monitoring the components of delivered RF power in semiconductor processing. Such devices are discussed, for example, in U.S. Pat. No. 5,770,992 (Waters), U.S. Pat. No. 5,565,737 (Keane), U.S. Pat. No. 6,046,594 (Mavretic), U.S. Pat. No. 5,808,415 (Hopkins) and U.S. Pat. No. 6,061,006 (Hopkins). All of these devices rely on AC coupled voltage and current measurements of the delivered RF power which serve as input signals to frequency discriminating detection circuits for harmonic analysis. Such a configuration places limitations on the detector circuits that can be used to analyze the broadband, harmonically distorted RF signals. Moreover, these devices require interface electronics to process the sampled signals before use in any subsequent application. Also, each of these devices is configured such that the transducer package and associated analysis or interface electronics package are calibrated together and cannot be separated without failure or degradation in overall performance. The shortcomings of such a configuration have been discussed above. There is thus a need in the art for a device for monitoring the harmonic content of delivered RF power that overcomes these deficiencies.

Another issue relating to RF power supplies for plasma reactors concerns the diagnosis of the components of an RF power delivery network. Semiconductor manufacturing facilities are extremely expensive to construct and operate. Consequently, every effort is made to minimize manufacturing tool down time, and maintenance and recovery of an off-line tool is always under excessive time constraints. Often, when a tool is taken off-line due to a failure to meet performance specifications, repair efforts suffer from a lack of diagnostics. Consequently, such repair efforts often become extremely expensive.

FIG. 14 shows a typical configuration for such a system. The system 100 comprises an RF generator 101, an impedance matching network 130, and a load 150. Generator 100 is coupled to impedance matching network 130 through a known impedance 120. This impedance is typically a nominal characteristic value, such as 50 ohms. Impedance 120 serves to facilitate optimal power transfer from the generator to matching network 130. The impedance 140 seen between matching network 130 and load 150 is generally unknown and varies over time.

Most RF power generators have "built-in" output measurement capability, but this is typically located remote from the impedance matching network. Measurement of input power at the input of the impedance matching network has historically been provided by utilization of bolo-meters, calorimeters, diodes and other types of instrumentation. Examples of prior art methods for making RF power measurements in coaxial environments may be found in U.S. Pat. No. 4,547,728 (Mecklenburg), U.S. Pat. No. 4,263,653 (Mecklenburg) and U.S. Pat. No. 4,080,566 (Mecklenburg), all of which rely on an inductive coil design to sample the RF voltage. However, since the measurement to be performed is typically diagnostic and only necessary during maintenance and troubleshooting, the cost, portability and ease of installation are of paramount concern.

Typical prior art methods for measuring the power at the output of the impedance network rely on alternating current (AC) coupled voltage and current measurements of the RF power delivered to the load. These measurements are input to frequency discrimination circuitry for the purpose of performing harmonic analysis. Examples of prior art methods for monitoring components for delivering RF power in semi-conductor processing are described in numerous patents, including, for example, U.S. Pat. No. 5,770,992 (Waters), U.S. Pat. No. 5,565,737 (Keane), U.S. Pat. No. 6,046,594 (Mavretic), U.S. Pat. No. 5,808,415 (Hopkins) and U.S. Pat. No. 6,061,006 (Hopkins). These systems also comprise a transducer package and associated analysis or interface electronics package which are calibrated together, and thus have the infirmities noted above (that is, they cannot be separated without degradation in overall performance).

Traditional RF power measurement technologies offer solutions in either the characteristic impedance portion of the delivery network or the non-characteristic impedance section without any integration of the two measurement devices. Some attempts have been made to integrate expensive and difficult to install frequency discriminating RF sensors, but these have met with poor acceptance due to price and installation issues. There is thus a need in the art for a means for field engineers to quickly, easily, cheaply and accurately diagnose the components of the RF power delivery network and determine which, if any, components of the system are faulty.

The above noted needs are met by the devices and methodologies disclosed herein and hereinafter described.

SUMMARY OF THE INVENTION

In one aspect, a system is provided herein for monitoring the harmonic content of the RF signal delivered to an RF powered device. The system comprises (a) a voltage transducer adapted to sample the voltage of the RF signal and to output a first signal representative thereof, (b) a current transducer adapted to sample the current of the RF signal and to output a second signal representative thereof, and (c) a memory device in communication with at least one, and preferably both, of said voltage transducer and said current transducer, said memory device containing calibration information specific to at least one, and preferably both, transducers. Since the calibration information is stored locally, field replacement of either the transducer package or the analysis and communications package can occur independently of the other package, without degradation in performance and without the need for recalibration.

In another aspect, methods and devices are provided herein for monitoring the voltage component of the harmonic content of an RF power source. Unlike existing voltage sampling schemes which are AC coupled and which thus prevent the measurement of self-bias voltage, methods and devices are disclosed herein which utilize DC coupled sampling of RF voltage. Consequently, RF voltage and self-bias voltage can be measured simultaneously and at the same point of measurement. The combination of a broadband sample of the RF voltage waveform and the self-bias voltage provides a more complete data set for process control.

In yet another aspect, a method and apparatus is provided herein for protecting inductive monitoring devices which operate in accordance with Faraday's Law from stray fields (both magnetic as well as electric) that can significantly impact the potential for accurate RF current measurements, without impeding the measurement of the desired primary RF current magnetic field. Preferably, devices made in accordance with this aspect comprise an RF current transducer, and a housing for the transducer which comprises a metal top and metal side walls. The housing is preferably constructed such that, when it is placed on a planar substrate, the side walls slant away from the top and towards said substrate. It is also preferred that the side walls are spaced apart from said top, and that the side walls are adapted to isolate said transducer from ambient electric or magnetic fields. The top, which may be supported by first and second end walls and which is preferably grounded, is higher than said side walls. The device may be used in combination with an RF current carrier such that the device is located in magnetic proximity to the RF current carrier, and such that the top is adapted to prevent crosstalk arising from electric field interference from the RF current carrier. In such embodiments, the side walls may be disposed in such a way that they do not over attenuate the magnetic field associated with said RF carrier.

In another aspect, a non-frequency discriminating RF deposition chamber clean end point detector is provided. This detector meets the price point, installation, field maintainability and functionality constraints of deposition chamber clean end point detectors. Since the RF detector does not employ frequency discrimination, a wide variety of detector circuits are available to analyze the broadband, harmonically distorted RF signals. These include, but are not limited to, peak detectors, averaging detectors and true RMS detectors. Moreover, the RF detector differs from other commonly found RF sensors in that there is no need for the interface electronics required by frequency discriminating units which process the sampled signals before use in any subsequent application.

In yet another aspect, a method and apparatus are provided herein for measurement of RF power at the input and output of an impedance matching network. The efficiency of that network may then be determined and monitored over time to ascertain the health of the network. Thus, in a preferred embodiment, a method is provided for measuring the power, $P_i$, at the input of an impedance network coupled to a generator through a known impedance environment. The method comprises the steps of (a) coupling to a voltage detector a signal proportional to the voltage at the input of the impedance network to produce an RMS voltage signal ($V_{rms}$), and (b) processing the RMS voltage signal to determine the power at the input of the impedance network. The input power can be determined using the simple formula $P_i = V_{rms}^2/(Z_c)$, where $Z_c$, the characteristic impedance, is known.

In still another aspect, a method is provided for measuring the power at the output of the impedance network, comprising the steps of (a) determining the voltage (V) and current (I) at that output, (b) determining the difference in phase, $\phi$, of the measured voltage and current, and (c) computing the power, $P_o$, from these measurements. More particularly, the power may be computed from the formula $$P_o = VI \cos \phi.$$

In another aspect, a method is provided wherein the measured values of $P_i$ and $P_o$ are utilized to determine a measure of efficiency, $\epsilon$, of the network: $\epsilon = P_o/P_i$. Evaluation of the efficiency of the impedance matching network then provides diagnostic information that can be utilized to ascertain the health of the network.

According to another aspect of the invention, a method is provided for communicating the value of input power by a first RF sensor for determining the RF power at the input of the impedance matching network to a remote location for observation, recording, and further processing. This is preferably accomplished using a MODBUS standard protocol or other suitable communications protocol (such as, for example, high speed serial) over TCP/IP. Similarly, the value of output power computed by a second RF sensor for determining the RF power at the output of the impedance matching network is also communicated to the remote location for observation, recording, and further processing. This is also preferably accomplished using a MODBUS standard protocol over TCP/IP. The efficiency can then be computed at the remote location.

According to yet another aspect of the present invention, a method is disclosed for providing power to the first and/or second sensors via power over the Ethernet. In some embodiments of the method, unique IP addresses may be stored in memory local to each sensor and transferred to the remote observation location to identify the locations of the particular measurements being observed.

The foregoing has outlined some aspects, features and technical advantages of the devices and methodologies disclosed herein in order that the detailed description of the invention that follows may be better understood. Additional aspects, features and advantages of the invention will be described hereinafter. It should be appreciated by those skilled in the art that the disclosure provided herein may be readily utilized as a basis for modifying or designing other structures for carrying out the same purposes of the present invention. Persons of skill in the art will realize that such equivalent constructions do not depart from the spirit and scope of the teachings herein.

One skilled in the art will appreciate that the various aspects of the present disclosure may be used in various combinations and sub-combinations, and each of those combinations and sub-combinations is to be treated as if specifically set forth herein.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

Preferred embodiments of the present invention are illustrated in the FIGURES, like numerals being used to refer to like and corresponding parts of the various drawings.

1. RF SENSOR FOR PROCESS CONTROL

Figure 1:
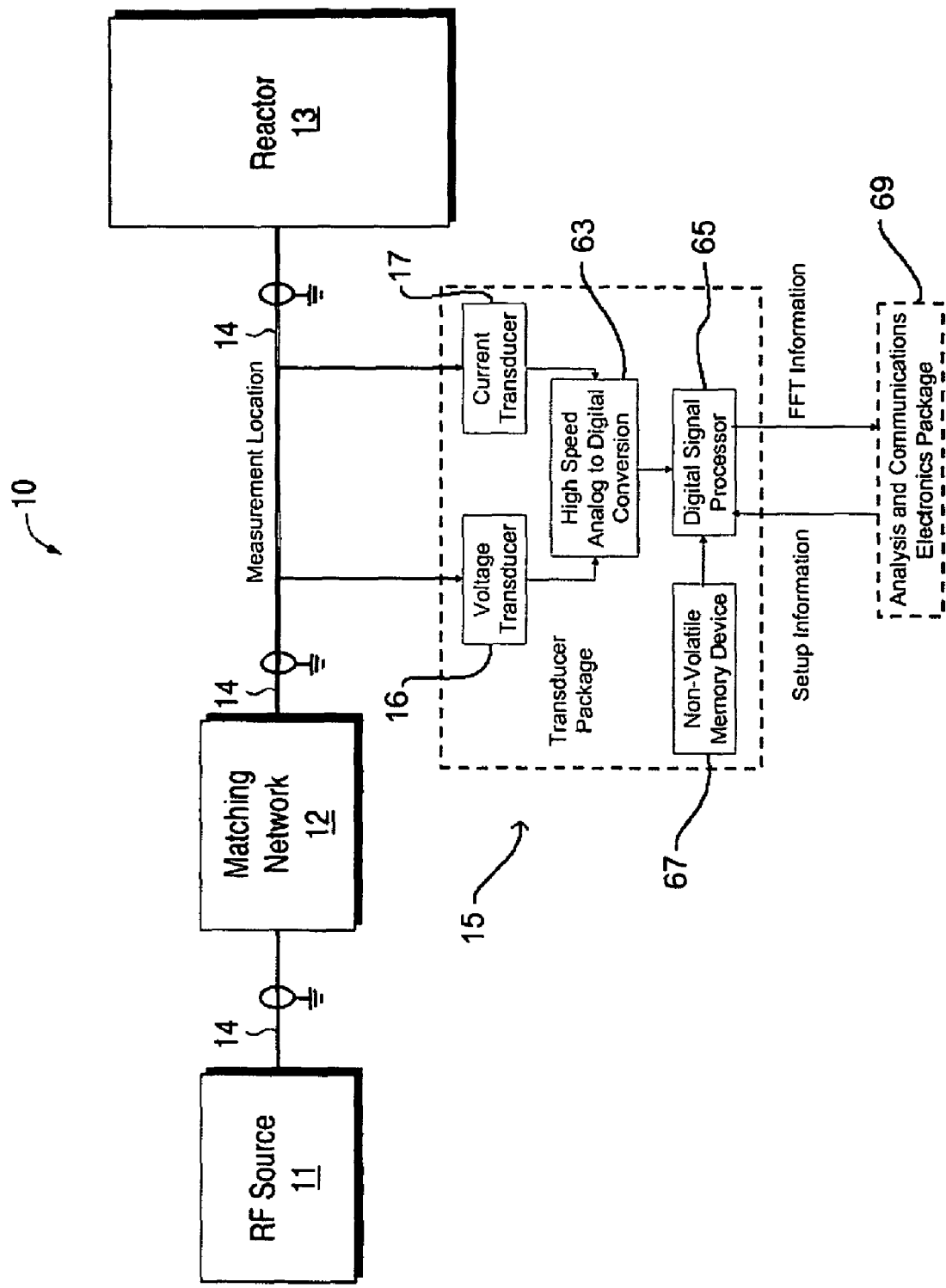
FIG. 1 presents a functional block diagram of an RF detector made in accordance with the teachings herein.

Referring to FIG. 1, a block diagram showing a utilization of an RF sensor in an RF controlled device made in accordance with the teachings herein is shown. In this exemplary system 10, an electrical source in the form of an RF generator 11 (RF source) is coupled to a processing reactor 13 through a matching network 12 by transmission line 14. The reactor 13 can be of a variety of reactors, such as a plasma reactor, for processing a variety of materials, including semiconductor wafers. Moreover, one skilled in the art will appreciate that a variety of processing systems utilizing electrical or microwave energy (including RF) sources are known to the art, and that any one of these systems, or various combinations of such systems, can be utilized in the practice of the teachings described herein. Furthermore, while the use of a matching network 12 is preferred, it is not necessarily needed in all applications of the sensor described herein.

As shown in FIG. 1, a transducer package 15 is inserted serially in the transmission line 14 (which is typically coaxial) in a location proximal to the reactor 13, and is preferably disposed at some point after the matching network 12. It is preferred to have the transducer package 15 in close proximity to the reactor 13 as possible, so that the measurements obtained from the transducer package 15 are indicative of actual V and I values entering the reactor 13. Both V and I values are sensed at substantially the same point on the transmission line 14 in order to determine the power entering the reactor 13 and, in some instances, a phase relationship between the V and I.

Appropriate broadband voltage 16 and current 17 transducers are incorporated into the transducer package 15. These transducers are designed to sample, respectively, the voltage and current components of the delivered RF power. The transducer package further includes a high speed analog to digital converter (ADC) 63, a digital signal processor (DSP) 65, and a (preferably non-volatile) memory device 67. The transducer package 15 is maintained in a measurement location which is local to the RF transmission line 14.

The configuration shown in FIG. 1 further comprises an analysis and communications package 69 which is located remote from the transducer package 15. Communications between the transducer package 15 and the remote analysis and communications package 69 typically comprise setup commands sent to the DSP necessary for proper operation of the Fast Fourier Transform (FFT) algorithm and the results of the FFT from the DSP.

The memory device 67 included in the transducer package is a notable improvement over existing transducer packages. This memory device stores necessary calibration information specific to the transducer package for access by the system, and may also store other appropriate information, such as serial numbers and other information necessary for tracking purposes. Since the calibration information for the transducers is available in the transducer package, there is no need to recalibrate the system when it is necessary to replace either the transducer package or the associated communications and analysis package. Consequently, the transducer package disclosed herein solves field maintenance problems common to RF sensor devices related to maintaining calibration when it is necessary to replace either the transducer or associated communications and analysis package. Recommend that we renumber FIG. 1 to match FIG. 2.

Figure 2:
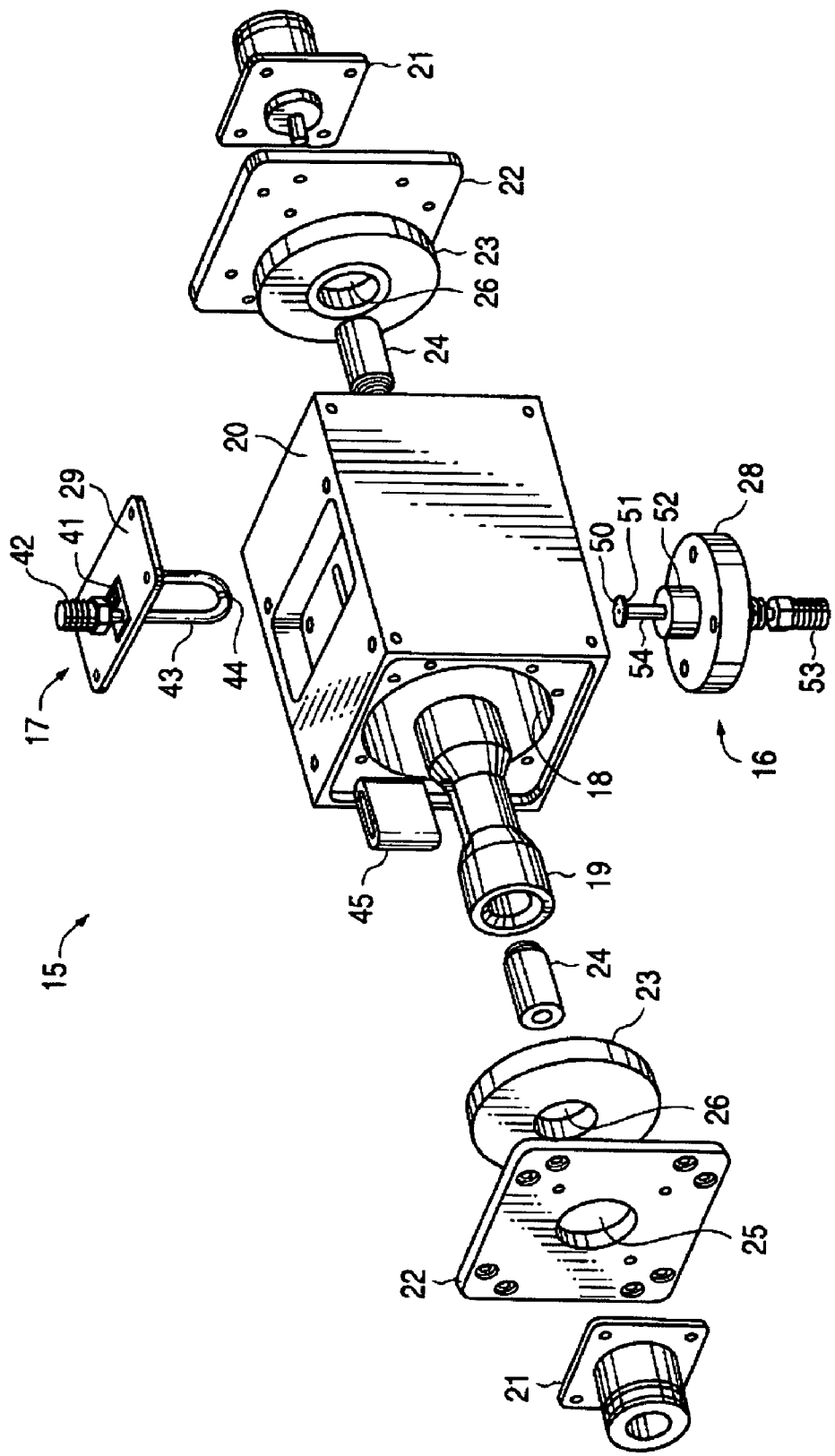
FIG. 2 is an exploded view of an RF detector made in accordance with the teachings herein.
Figure 3:
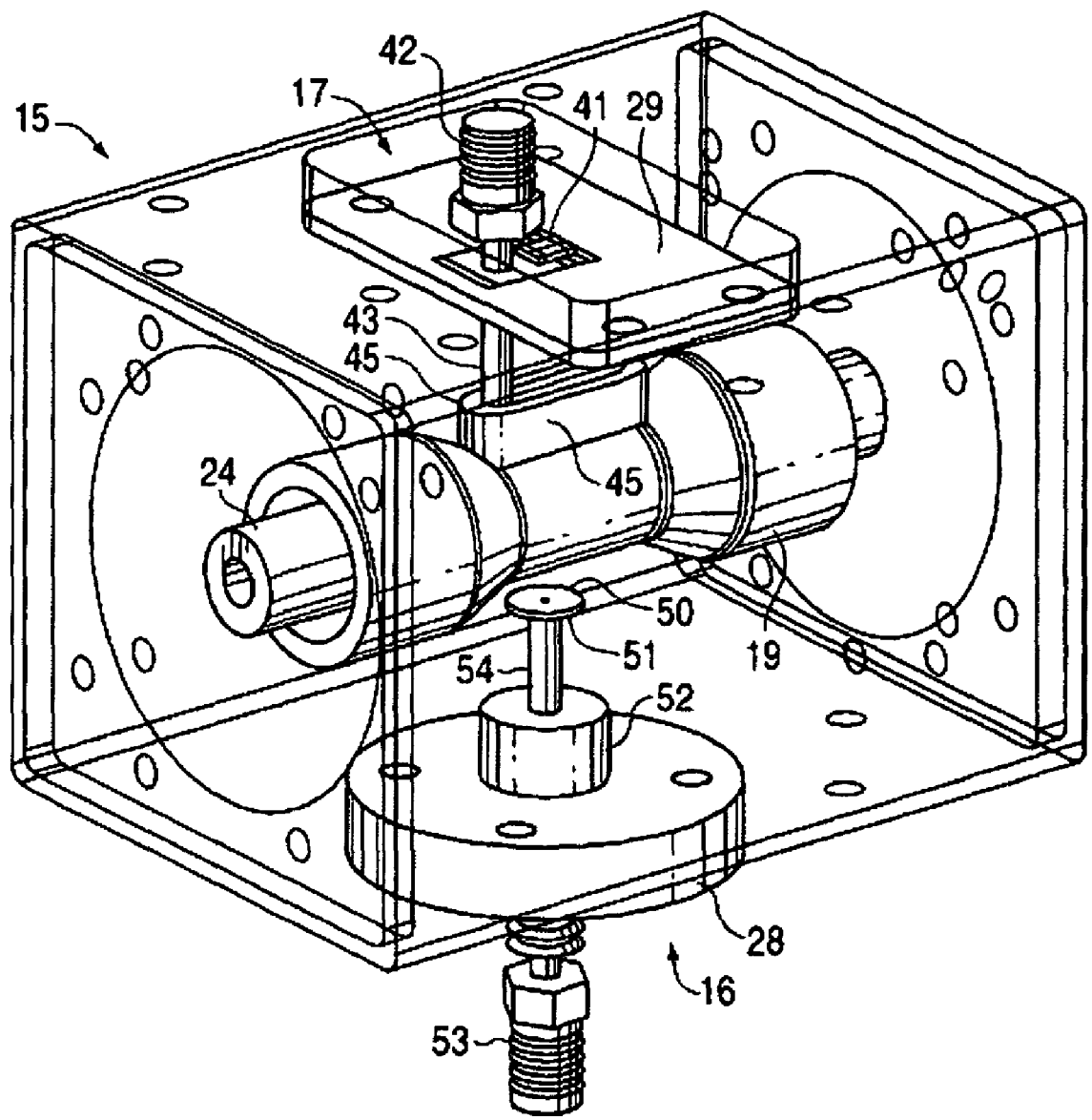
FIG. 3 is a perspective view of the RF detector of FIG. 2 in which the walls of the device have been made transparent for purposes of illustration.
Figure 4:
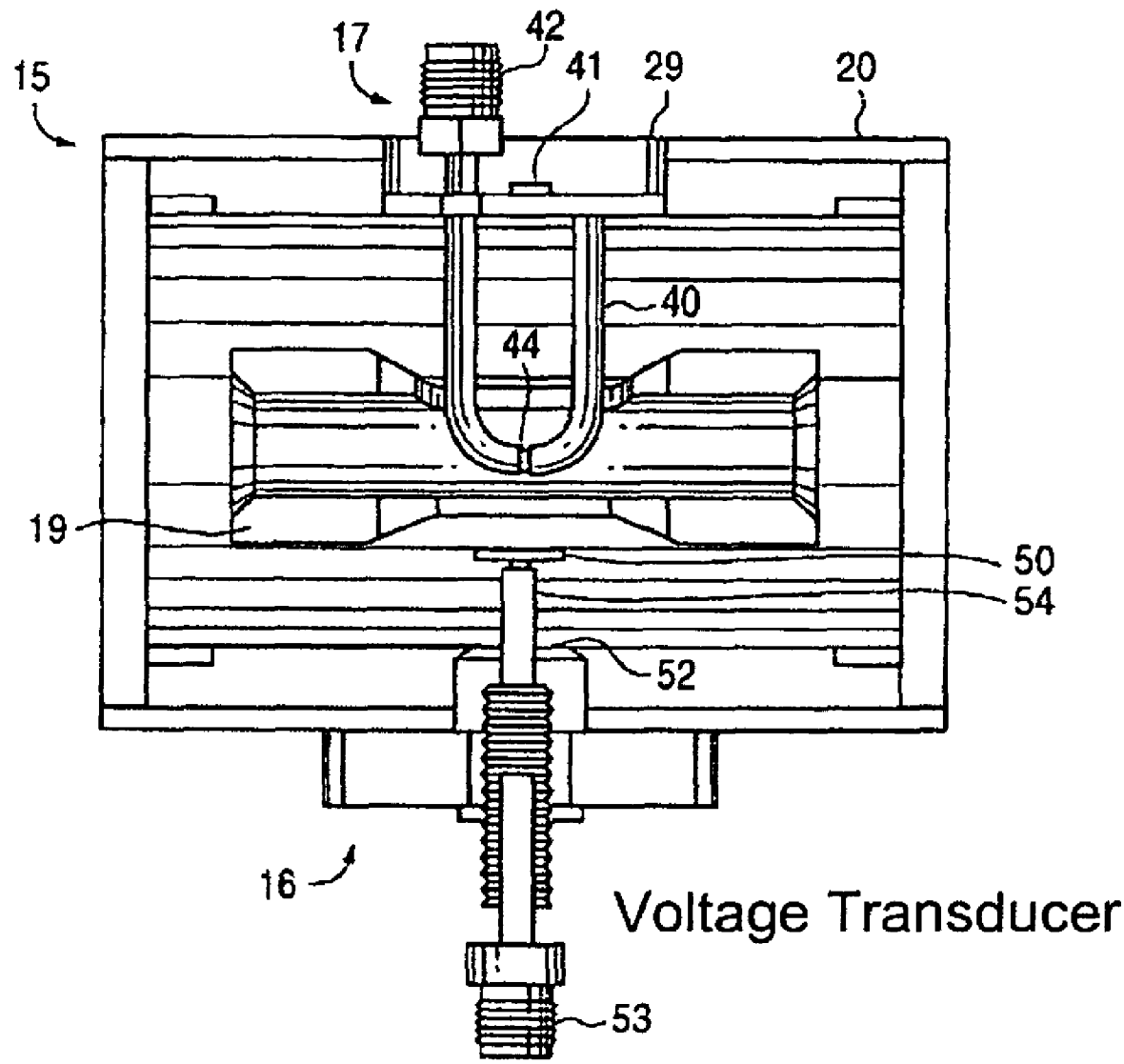
FIG. 4 is a side view, partially in section, of the RF detector of FIG. 3.

Referring to FIGS. 2 and 3, one possible embodiment of the transducer package 15 is shown. FIG. 2 is an exploded view of the various components of the transducer package 15, while FIG. 3 is an assembled view. A housing 20 is used to house the various component parts of the transducer package 15. The housing 20 in this embodiment is a rectangular-shaped box having an input at one end and an output at the opposite end. A center conductor 19, which resides within the housing 20, provides the conducting medium for the center (or inner) conductor of the transmission line 14 (see FIG. 1). Thus, the center conductor 19 becomes the driven part of the main transmission line 14, between the input and output ends of housing 20. An input/output (I/O) connector 21 at each end of the housing 20 is mounted onto a respective end plate 22, which is then mounted onto the respective end of the housing 20. One end of the I/O connector 21 couples to the transmission line 14, while the other end extends into an opening 25 of the end plate 22 to couple to the center conductor 19. A conducting sleeve 24 is utilized to mate the plug end of the connector 21 to the center conductor 19, which has a larger diameter opening than the plug. An insulating washer 23, having a central opening 26, is utilized to centrally support the center conductor 19 in position within the housing 20 at each end, when each connector 21 and end plate 22 are mounted onto the housing 20. Screws, bolts or other fastening devices are used to mount the connectors 21 onto the end plates 22 and the end plates 22 onto the housing 20.

The voltage transducer 16 and the current transducer 17 are mounted substantially midway between the two ends of the housing 20, but disposed at opposite sides of the housing 20 from each other. As noted in FIGS. 2 and 3, both the voltage transducer 16 and the current transducer 17 are mounted onto the housing 20, and each has a respective cover plate 28 or 29 to mount the assemblies 16-17 into the housing 20. The voltage transducer 16 and current transducer 17 each have respective connector 53 or 42, which extend through respective cover plate 28 or 29 for providing external connections, similar to the I/O connectors 21.

Figure 5:
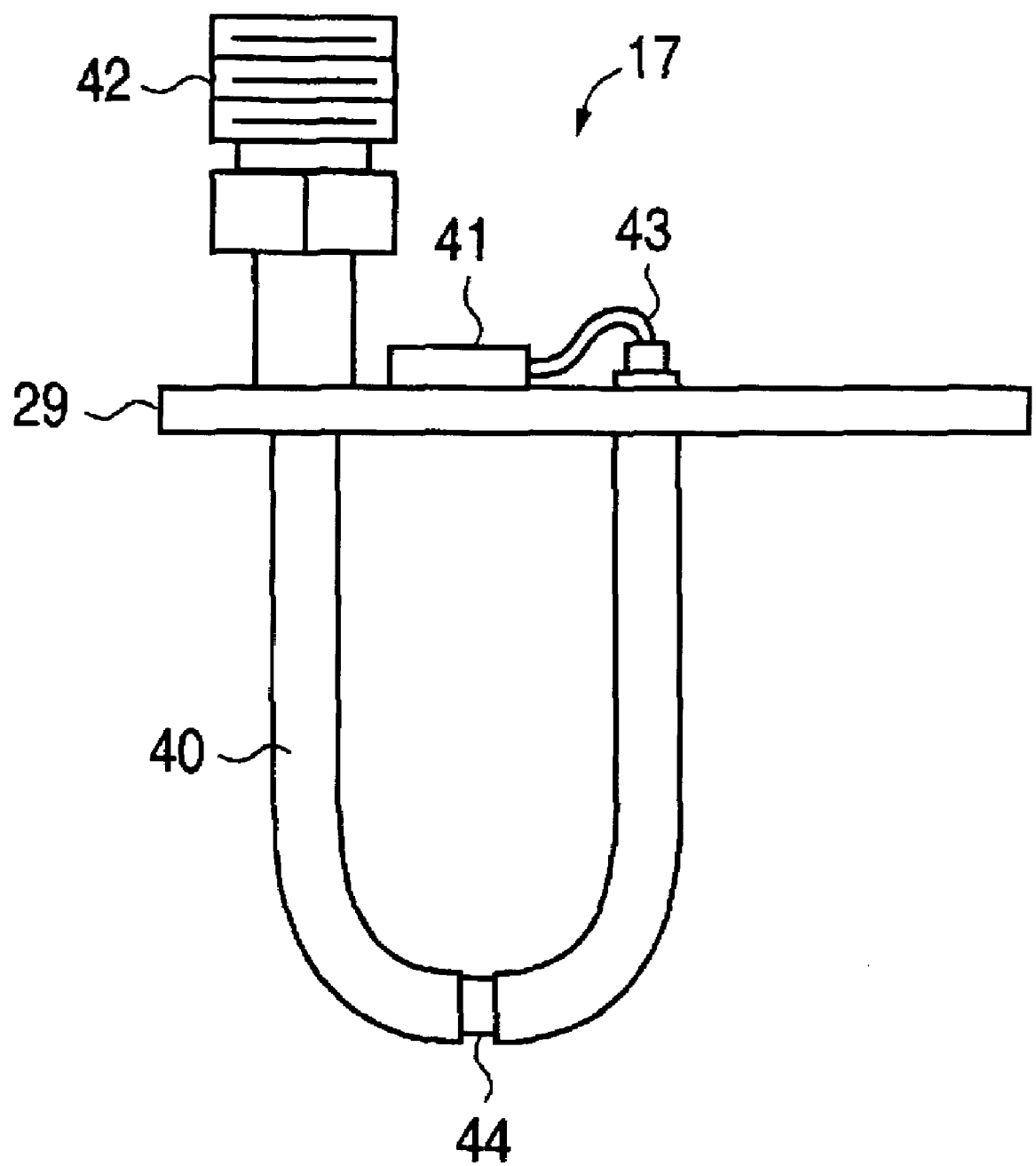
FIG. 5 is a side view of a current transducer that can be employed in the devices and methodologies disclosed herein.

One possible embodiment of the current transducer 17 is shown in greater detail in FIG. 5. The current transducer in this embodiment includes a U-shaped pickup coil (or coil loop) 40, a plate 29, a termination 41, and a connector 42. The pickup coil 40 is a coaxial transmission line, having a center conductor surrounded by a conducting return. Although a typical coaxial cable with a braided return can be used, the coil loop 40 of the preferred embodiment utilizes a solid metal outer casing surrounding an inner conductor. This outer casing is coupled to the plate 29 at the termination end, and to the plate 29 and the connector 42 at the other end. The inner conductor 43 of the coil 40 is coupled to the inner conductor of the connector 42 at one end and to the termination 41 at the other. The termination 41 is a circuit component (such as a resistor) for providing a matching termination impedance at the end of the coil 40. The termination impedance should match the characteristic impedance of the coil 40 (for example, 50 ohms) and the same applies to the impedance presented by the transducer package 15 of FIG. 1 coupled to the connector 42. Thus, the center conductor of coil 40 is terminated at both ends by its characteristic impedance. The outer casing of the coil 40 has a cut (or slit) 44 at the apex of the U-shape to fully break the electrical connection of the casing at the apex. Thus, centrally disposed, the cut 44 is located at the mid-point of the coil 40. It is to be noted that only the casing is cut and not the inner conductor of the coil 40.

When the current transducer 17 is assembled and disposed within the housing 40, the central portion of the coil 40, having the cut 44, is inserted into an opening of the center conductor 19, as shown in FIG. 3. An insulating sleeve 45 is inserted into the opening of conductor 19 and the apex of the U-shaped coil 40 (having cut 44) is inserted into the sleeve 45. The insulating sleeve electrically insulates the coil casing (which is at ground potential) from the conductor 19. The cut 44 resides within the insulating sleeve 45. Preferably, the insulating sleeve 45 is fabricated from TEFLON® brand fluoropolymers or other such materials that can provide the desirable dielectric constant for providing impedance matching in the transition region.

It is to be noted that, in some embodiments, the coil 40 may not be fully inserted into the center of the current carrier 19, in which case the insulating sleeve 45 may not be needed. In such embodiments, Faraday's law may not be perfectly implemented, thus requiring appropriate calibration. However, this type of approach is nonetheless advantageous in that it can resolve the potential for arcing, which is the primary reason for using the insulating sleeve 45 in the first place.

The plate 29 is mounted onto the housing 20 and forms part of the return path for the transmission line 14. Thus, the casing of the coil 40 is grounded at both ends, but does not form a continuous ground path, since the cut 44 is present. The plate 29 is then mounted onto the housing 20.

Figure 6:
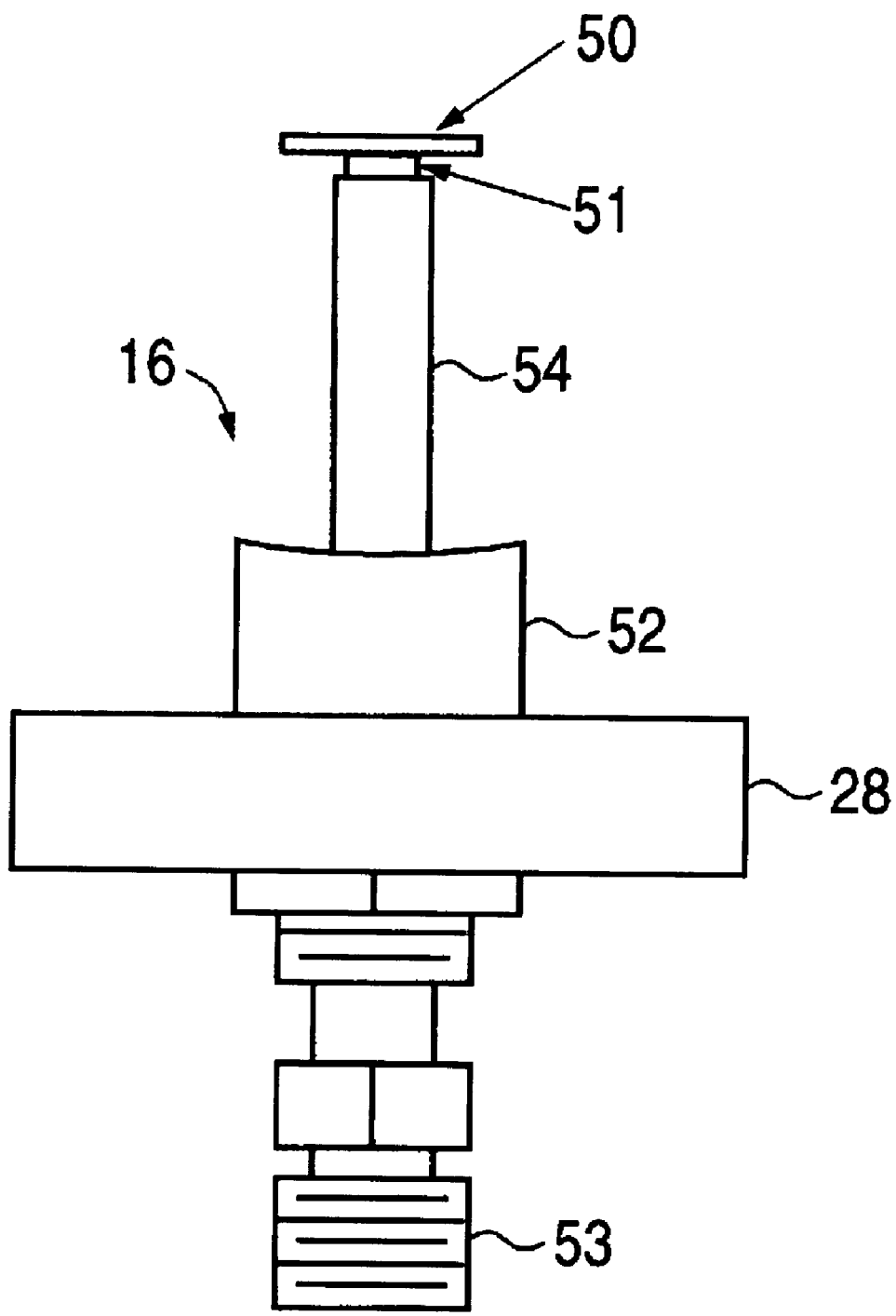
FIG. 6 is a side view of a voltage transducer that can be employed in the devices and methodologies disclosed herein.

One possible embodiment of the voltage transducer 16 is shown in greater detail in FIG. 6. The voltage transducer includes a flat conducting plate 50 coupled to an inner conductor 51 of a coaxial line 52. The other end of the coax line 52 is coupled to a connector 53 mounted onto the cover plate 28. The transducer package 61 (but probably should be 15) of FIG. 1 is coupled to connector 53 to measure the voltage sensed by the voltage transducer 16. When installed, the coax line 52 will have the same impedance as the external line coupled to the connector 53 and the transducer package 15 (of FIG. 2) will be impedance matched as well. Accordingly, the impedance is matched from the transducer package 15 all the way to the tip of the conductor 51 where it mates (typically via a solder joint) to the plate 50.

When the voltage transducer 16 is assembled into the housing 20 by mounting the cover plate 28 thereon, the flat plate 50 is made to reside proximal to the center conductor 19, but not touching the center conductor 19 nor touching the outer conductor 18. The plate 50 is positioned at approximately the midway point along conductor 19, similar to the current probe 17. Preferably, the voltage transducer 16 is positioned at the opposite side of the conductor 19 from the current transducer 17. It is desirable to obtain current and voltage sensing at the same linear location on the center conductor 19 so that accurate power measurements (P=V*I) can be obtained.

One of the unique features of the above noted devices and methodologies relative to existing devices and methodologies of this type as are known to the art is the conversion of the high frequency analog signal to a digital protocol suitable for processing local to the point of measurement. When combined with the local storage of necessary calibration information, this feature provides a calibrated digital output of measured values.

2. RF SENSOR VOLTAGE TRANSDUCER

Figure 7:
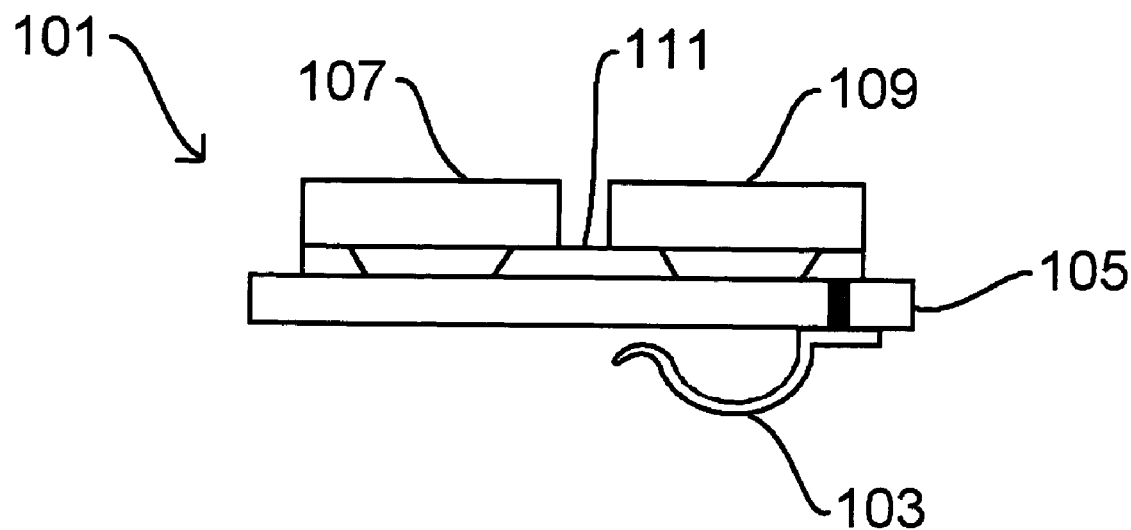
FIG. 7 is a side view of a voltage transducer made in accordance with the teachings herein.
Figure 8:
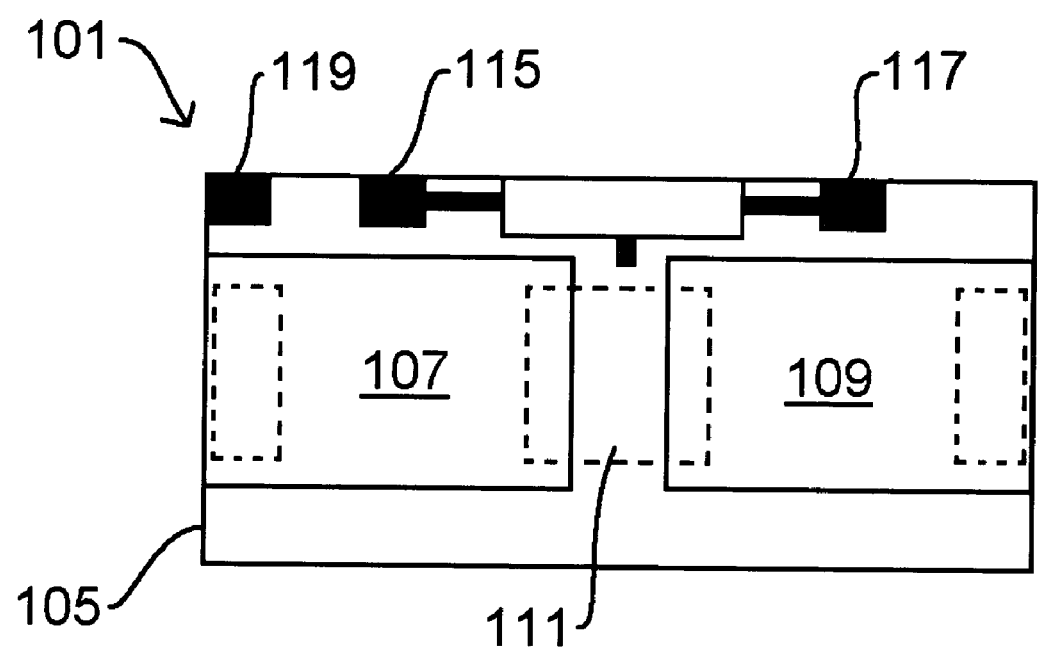
FIG. 8 is a top view of a voltage transducer made in accordance with the teachings herein.

FIGS. 7 and 8 are a side view and plan view, respectively, of one embodiment of a dc coupled RF sensor voltage transducer 101 made in accordance with the teachings herein. The voltage transducer 101 differs from the voltage transducer 16 of FIGS. 2, 3, 4 and 6 in that it is dc coupled, thus allowing for measurement of the dc self bias voltage. As seen therein, the transducer comprises a beryllium copper spring 103 that makes direct contact with the primary RF current carrier (not shown). The configuration is such that a press fit contact can be maintained on either a flat or cylindrical current carrier. The DC coupled RF voltage transducer 101 consists of first 107 and second 109 high voltage, non-inductive resistors and a bias tee device 111 adapted to separate the RF from the DC self-bias voltage component. Both the high voltage RF as well as the high voltage self-bias voltage are sampled according to the ratio (R2/(R1+R2)). Bond pads provide for connection to the surface mount device outputs for the RF voltage ($V_{RF}$) 115, DC voltage ($V_{DC}$) 117 and ground (GND) 119.

The DC coupled RF voltage transducer 101 can be enclosed in an appropriate dielectric case (not shown) to protect it from the environment, while minimizing impact to the load impedance which might otherwise change the characteristics seen by an RF power delivery network. As described herein, the voltage transducer may also be coupled with appropriate frequency dependent analysis electronics to provide for harmonic content analysis, detector circuitry for relative measurements, and appropriately configured RF current transducers.

3. RF DETECTOR FOR SEMICONDUCTOR PROCESSING

Figure 9:
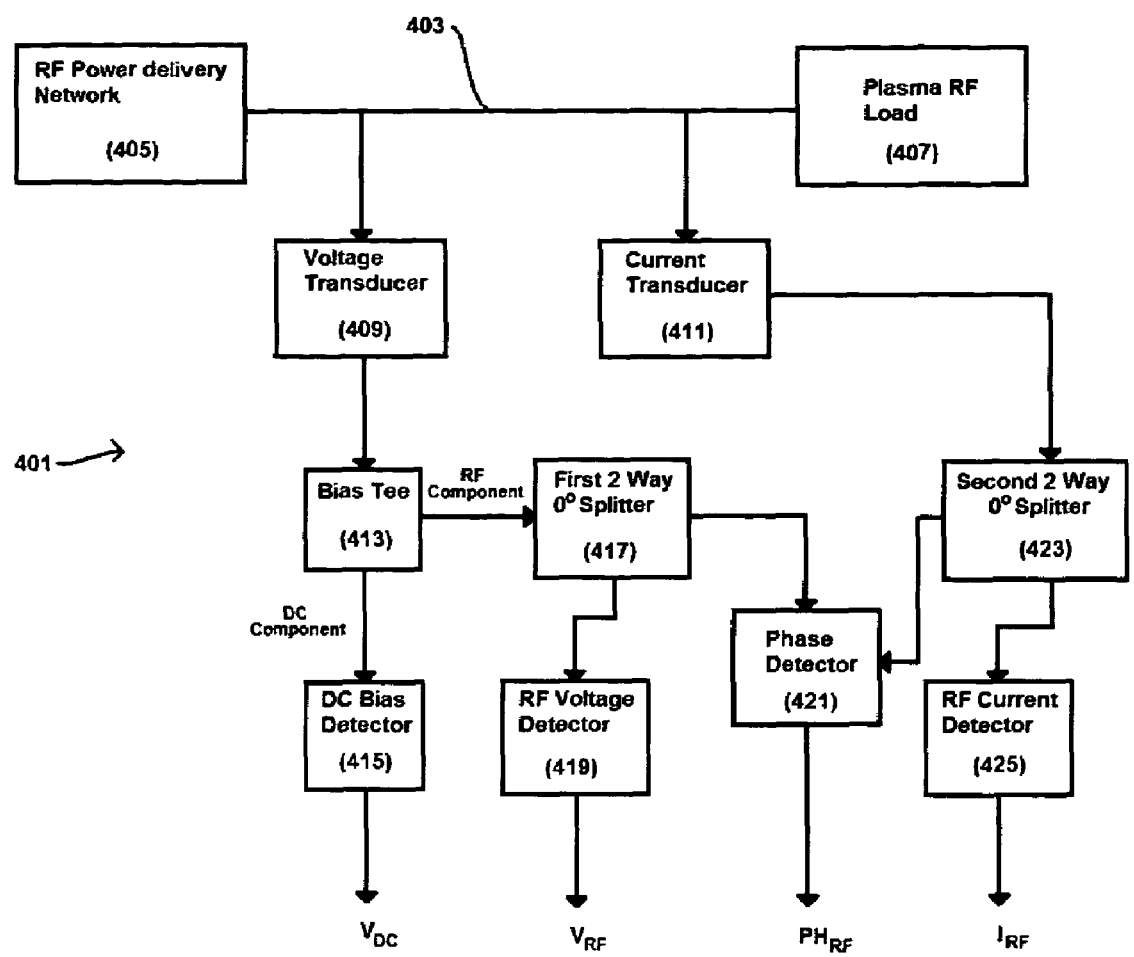
FIG. 9 is a functional diagram of an endpoint detector made in accordance with the teachings herein.

FIG. 9 illustrates the functional architecture of one possible embodiment of an RF detector 401 (not shown) made in accordance with the teachings herein. The RF detector is coupled to an RF power delivery line 403 between an RF power delivery network 405 and a plasma RF load 407. An appropriate DC coupled voltage transducer 409 and AC coupled current transducer 411 are used to sample the RF voltage and current signals at the point of use. These samples are then made available for detection by various means depending on the desired accuracy of measurement.

The RF detector 401 contains a bias tee 413 which separates the signal output by the voltage transducer 409 into a DC component and an RF component. The DC component of the signal is input to a DC bias detector 415, which outputs the DC voltage ($V_{DC}$) parameter. The RF component of the signal is input into a first 2 way 0° splitter 417. The first 2 way 0° splitter 417 is in communication with an RF voltage detector 419 that outputs the RF voltage ($V_{RF}$) parameter, and a phase detector 421.

The RF detector 401 further contains a second 2 way 0° splitter 423. The second 2 way 0° splitter 423 is in communication with an RF current detector 425 that outputs the RF current ($I_{RF}$) parameter, and with phase detector 421. Phase detector 421 outputs the phase angle of the RF current relative to the RF voltage ($PH_{RF}$) parameter based on the inputs from the first 417 and second 423 2 way 0° splitters.

For common applications which do not have an accuracy specification, or for applications where it is desirable not to furnish operating power, the detectors may be of a peak or averaging nature. For applications where accuracy is an issue and operating power can be furnished, the detectors may be "true RMS" type.

By eliminating frequency discrimination capability, both the cost and the physical size of the end point detector is minimized, thereby facilitating installation and broadening the applications of the device. The outputted signals would typically only be of a relative accuracy with peak or averaging detectors, due to the harmonic distortion of the voltage and current waveform. However, true RMS detectors could be made accurate by providing calibration coefficients to be used in any analysis software.

U.S. Pat. No. 5,576,629 (Tompkins et al.) and U.S. Pat. No. 5,939,886 (Turner et al.) disclose methods and systems for controlling the components of the delivered RF power, and describe how they may be used for end point detection. However, in contrast to the approaches described in these references, in the approach described herein, the components of the delivered RF power are not being controlled. Rather, these components are merely being detected, after which the corresponding signals can be made available to systems such as those described in U.S. Pat. No. 5,576,629 (Tompkins et al.) and U.S. Pat. No. 5,939,886 (Turner et al.) for actual control.

4. RF SENSOR CURRENT TRANSDUCER

Figure 10:
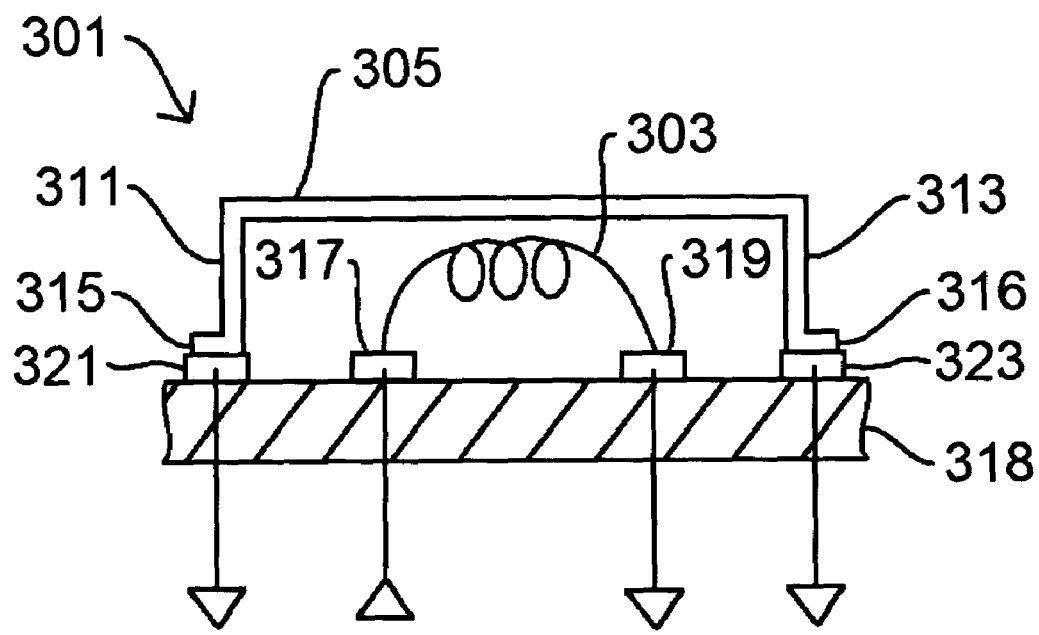
FIG. 10 is a side view of a shielding scheme for an RF sensor current transducer made in accordance with the teachings herein.
Figure 11:
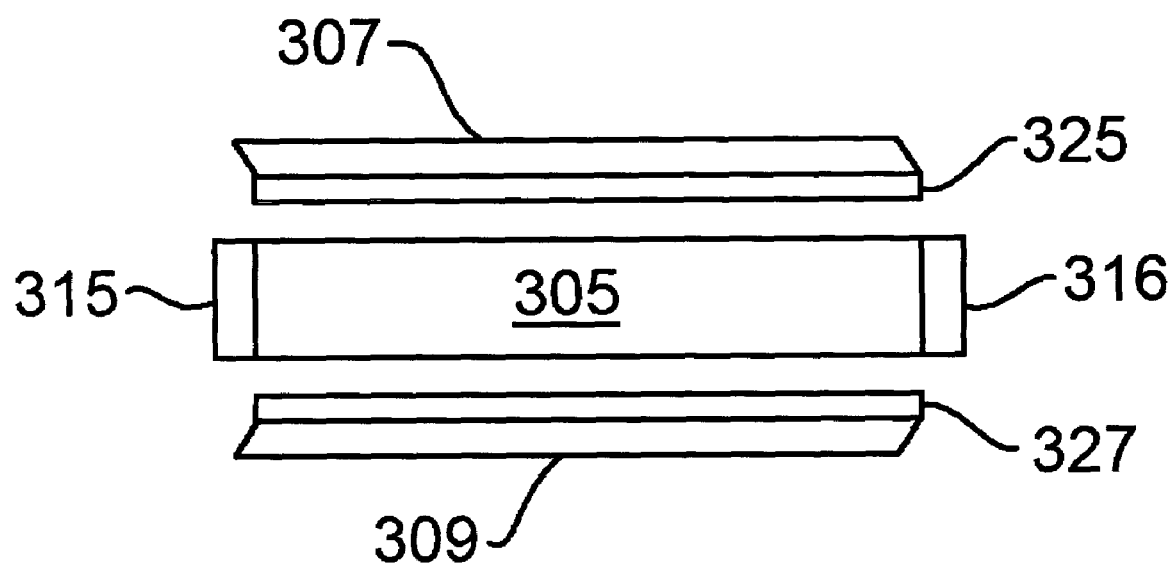
FIG. 11 is a top view of a shielding scheme for an RF sensor current transducer made in accordance with the teachings herein.
Figure 12:
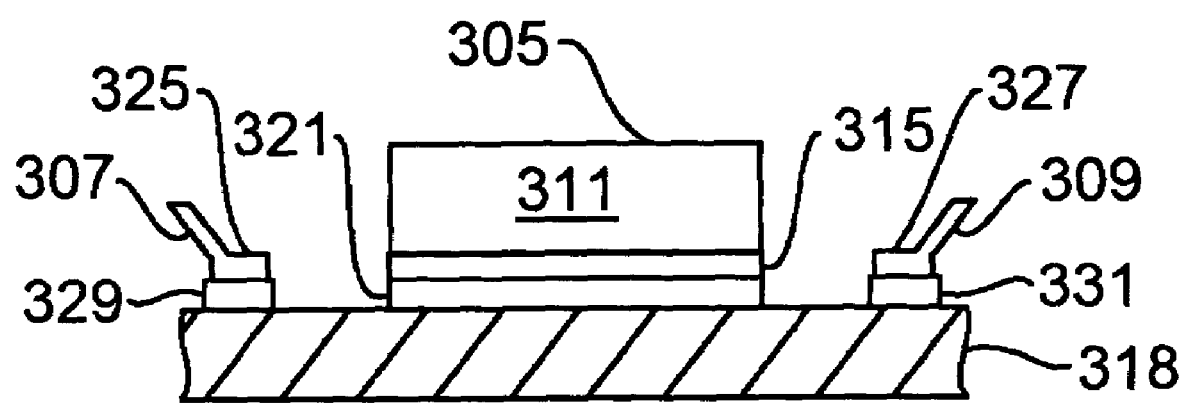
FIG. 12 is a side view of a shielding scheme for an RF sensor current transducer made in accordance with the teachings herein.

FIGS. 10-12 illustrate a housing assembly 301 for the surface mounted transducer coil 303 of an RF sensor made in accordance with the teachings herein. The housing assembly consists of a top 305, first 307 and second 309 side walls (see FIGS. 11 and 12), and first 311 and second 313 end walls (see FIGS. 10 and 11). The end walls terminate in flanges 315, 316 which are mounted to the substrate 318 by way of contact pads 321, 323, respectively. Similarly, the side walls 307, 309 are mounted to the substrate 318 via contact pads 325 and 327, respectively.

The side walls have been omitted from FIG. 10 for the purposes of clarity so that the placement of the surface mounted transducer coil 303 within the housing assembly 301 may be readily appreciated. The transducer coil 303 operates in accordance with Faraday's law, and is mounted to the substrate 318 via first 317 and second 319 contact pads.

The top 305, which is preferably metal, is adapted to prevent crosstalk due to electric field interference from the RF current carrier (not shown) which will be located in magnetic proximity to the transducer coil 303. The side walls 307, 309 are also preferably metal. The primary purpose of the side walls is to isolate the transducer coil 303 from stray electric or magnetic fields which may be present in the ambient environment and which will result in degradation of the measurement due to induced error.

As shown in FIG. 11, which is a top view of the housing assembly 301, the assembly is situated on a substrate 318 such that the first 307 and second 309 side walls are oriented at an angle with respect to the substrate 318, with the side walls slanting away from the top 305. The angle at which the side walls 307, 309 are oriented with respect to the substrate 318 is chosen so that the side walls will not over-attenuate the magnetic field from the primary RF current carrier (not shown). Moreover, as seen in FIG. 12, the side walls 307, 309 are preferably of a different height than the top 305. The result of the angular disposition of the side walls 307, 309 with respect to the substrate 318, and the reduced height of the side walls 307, 309, is to create a sort of funnel for the magnetic field lines of interest from the primary RF current carrier.

5. RF POWER DELIVERY DIAGNOSTIC SYSTEM

Figure 13:
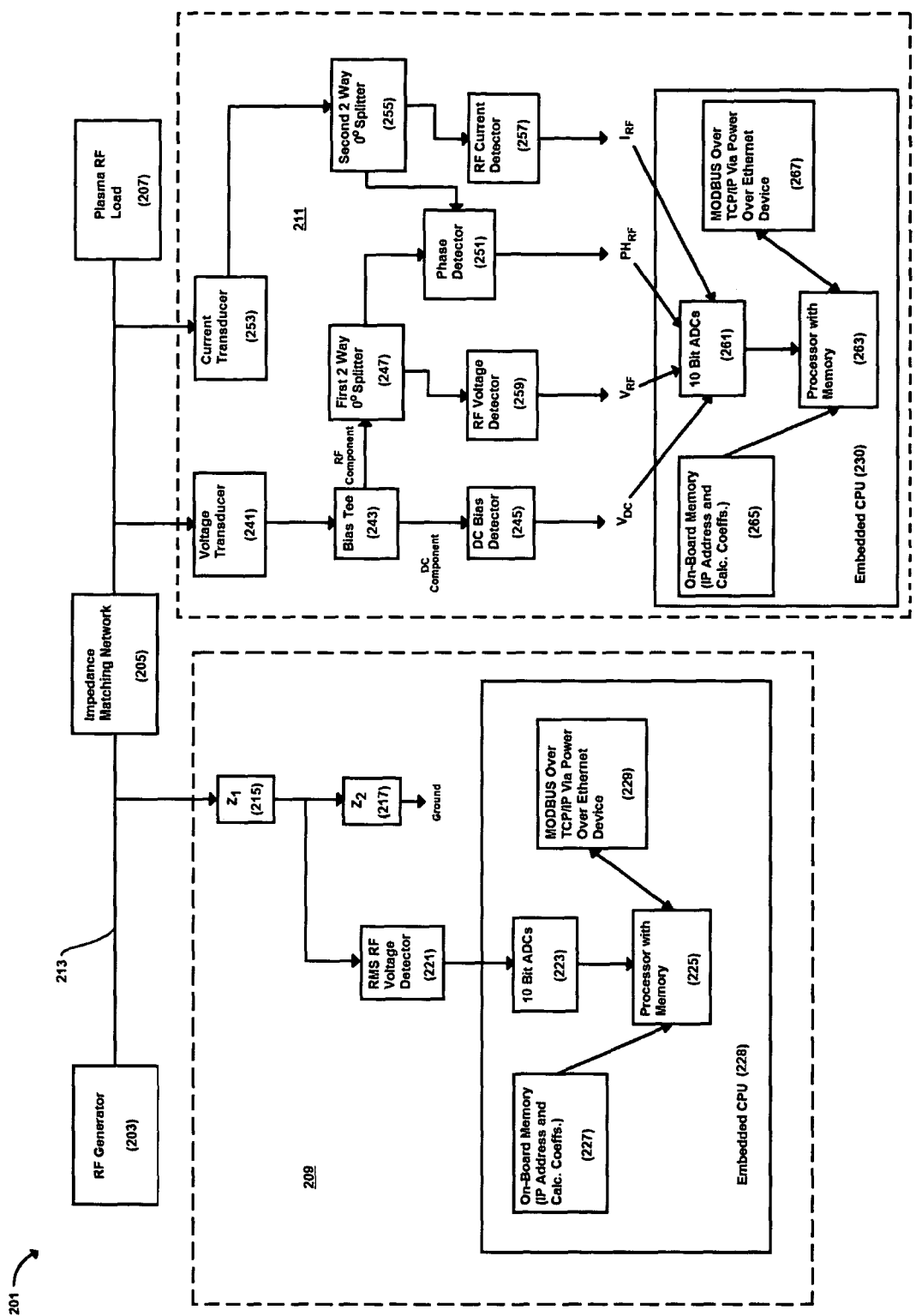
FIG. 13 is a schematic illustration of an RF sensor for measuring the RF power at the input of an impedance matching network.
Figure 14:
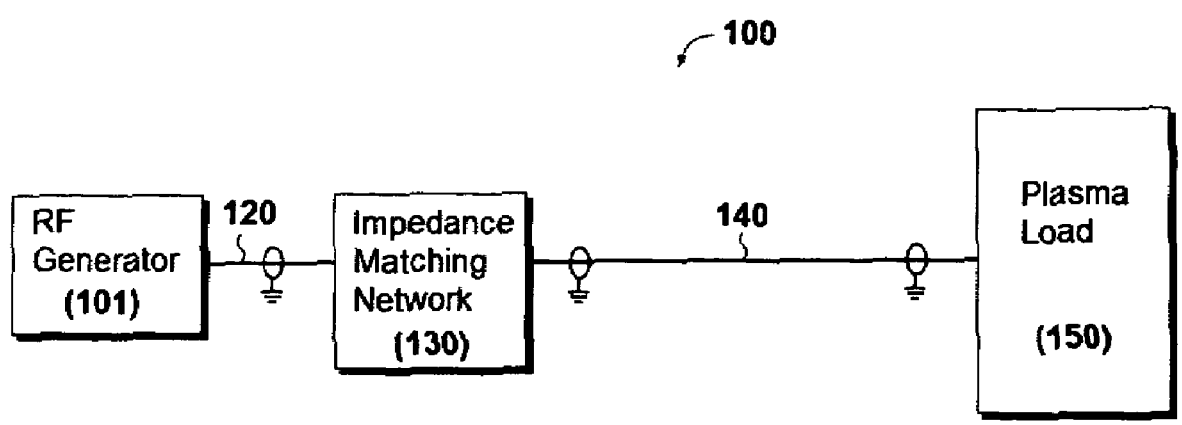
FIG. 14 is an illustration of a conventional RF power delivery system.

A preferred embodiment of an RF power delivery diagnostic system made in accordance with the teachings herein is illustrated in FIG. 13. As shown therein, the system 201 includes an RF generator 203, an impedance matching network 205, and a plasma load 207. The plasma load 207 may correspond to any of the various RF driven devices, including, for example, a plasma etch reactor.

A first RF sensor 209 is provided for measuring the RF power at the input of an impedance matching network, and a second RF sensor 211 is provided for measuring the RF power at the output of the impedance matching network. The resultant measurements from the sensors 209 and 211 may be communicated to a remote location.

The RF power generator 203 is coupled to the impedance matching network 205 via a power line 213 having an impedance environment that exhibits an impedance $Z_c$. Typically, the value of $Z_c$ will be about 50 ohms, although persons of ordinary skill in the art will appreciate that environments exhibiting other impedances are often encountered, and that the system disclosed herein is not limited to any particular impedance values.

Within the first RF sensor 209 is a voltage divider network that comprises two impedance components 215 and 217 having respective impedances $Z_1$ and $Z_2$. The voltage divider network serves to present to an RMS RF voltage detector 221 a voltage proportional to the RF voltage at the input of the impedance matching network 205. The impedance components 215 and 217 of the voltage divider network may be implemented with resistive and/or capacitive components, thereby eliminating the implementation difficulties encountered with the inductive components of the prior art.

In response to the voltage input to detector 221 from the divider network, detector 221 produces an output analog signal representative of the RMS voltage at the input of the impedance matching network 205. Voltage detector 221 may be implemented using a commercially available integrated circuit.

Embedded within the sensor 209 is a processor 228. Processor 228 receives the output of RF voltage detector 221 and converts it to a digital signal by way of an Analog-to-Digital Converter (ADC) 223. A processing unit 225 receives the digital signal from ADC 223. Processing unit 225 may be implemented using a microprocessor or other digital device capable of accomplishing the requisite functions described herein. Processing unit 225 is also coupled to an on-board memory unit 227 containing calibration coefficients. The calibration coefficients are used to correct for error due to component deviation from nominal values. For example, if resistors are employed as impedance components 217 and 219 for impedances $Z_1$ and $Z_2$, respectively, of the voltage divider network, these resistors will typically deviate from their nominal values by a small percent.

The calibration coefficients may, for example, be chosen to implement a polynomial solution to correct for such errors:

$$y = c + bx + ax^2 \quad \text{(EQUATION 1)}$$

where x is the input digital representation of the RMS signal from detector 221, a, b, and c are the calibration coefficients from memory unit 227, and y is the calibrated RMS signal, $V_{rms}$. Then, the RMS RF power at the input to impedance matching network 205 is determined in accordance with EQUATION 1:

$$P_i = V^2_{rms}/(Z_c) \quad \text{(EQUATION 2)}$$

where $Z_c$, is the known characteristic impedance of the power line 213 that couples the generator 203 to the impedance matching network 205.

The measured input power may then be communicated to a remote location or, either alternatively or additionally, to an output power sensor, to be observed, recorded, transmitted or further processed. Communication between the remote location and/or the output power sensor and input power sensor is preferably implemented by a MODBUS 229 using standard protocol over TCP/IP. Moreover, the same communications port may provide power to an input power sensor using power over Ethernet technology to allow for a single data and power access point on the sensor.

The memory unit 227 may also store an IP address identifying the particular measurement location of the first RF sensor 209. Thus, for example, in a network with a plurality of sensors at different locations, communications for each location is provided, enabling selection of the location where a power measurement is to be performed and identification of the location from which a power measurement is received.

At the output of the impedance network 205, the power is measured by an output power sensor 211. Voltage at the output of network 205 is DC coupled to voltage transducer 241, which in a preferred embodiment, acts essentially as a voltage divider to step-down the sensed voltage. The output of the voltage transducer 241 is fed to a bias-tee 243, which separates the DC and AC components of the received voltage. The DC component is detected by DC bias detector 245 and the AC component is fed to a first two-way power splitter 247. One branch of the first power splitter 247 feeds an RF voltage detector 259, and the other output branch of the first power splitter 247 feeds a phase detector 251.

Current at the output of impedance matching network 205 is AC coupled to current transducer 253, the output of which is fed to a second two-way power splitter 255. One branch of the second power splitter 255 feeds an RF current detector 257, and the other output branch feeds phase detector 251.

Phase detector 251 measures the difference in phase between the voltage signal received from the first power splitter 247 and the current signal received from the second power splitter 255. RF voltage detector 259 provides a signal representative of the RMS value of the voltage at the output of impedance network 205. RF current detector 257 provides a signal representative of the RMS value of the current at the output of impedance network 205. The outputs of DC bias detector 245, phase detector 251, RF voltage detector 259, and RF current detector 257 are input to an analog-to-digital converter (ADC) 261 which is disposed within an embedded CPU 230 and which converts these signals to digital form for use by a processing unit 263.

Processing unit 263 may be implemented using a microprocessor or other digital device capable of accomplishing the requisite functions described herein. Processing unit 263 is also coupled to an on-board memory unit 265 containing calibration parameters. The calibration parameters are used to correct for error due to, for example, component deviation from nominal values.

Calibration coefficients may, for example, implement a polynomial solution such as EQUATION 1 above to correct for such errors, where x is the input digital representation of the RMS signal from RF voltage detector 257 or RF current detector 259, a, b, and c are the calibration coefficients from memory unit 265 for the signal from the particular detector, and y is the calibrated RMS output signal, $V_{rms}$, or $I_{rms}$. Then, the RMS RF power at the output of impedance matching network 205 is determined from the calculation:

$$P_o = V_{rms} I_{rms} \cos \phi \quad \text{(EQUATION 3)}$$

where $\cos \phi$ is the cosine of the phase between the voltage and current.

The measured output power may then be communicated to a remote location, or alternatively or additionally, to an input power sensor, to be observed, recorded, transmitted or further processed. Communication between the remote location and/or the input power sensor and output power sensor is preferably implemented by a MODBUS 267 using standard protocol over TCP/IP. Moreover, the same communications port may provide power to an output power sensor using power over Ethernet technology to allow for a single data and power access point on the second RF sensor 211. Memory unit 265 may also store an IP address identifying the location, and hence, the particular measurement location, of the second RF sensor 211. Thus, for example, in a network with a plurality of sensors at different locations, communications for each location is provided, enabling selection of the location where a power measurement is to be performed and identification of the location from which a power measurement is received.

Given the input and output powers, $P_i$, and $P_o$, an efficiency value, $\epsilon(t)$ may be computed and observed over time to track the health of the impedance matching network 205. Efficiency, $\epsilon(t)$, may be computed at remote location, or may be computed within the processing unit of the first 209 or second 211 RF sensors.

One skilled in the art will appreciate from the above description that the RF power delivery diagnostic system described herein provides for measurement of both the power at the input of an impedance matching network and the power at the output of the impedance matching, and enables diagnostic characterization of the entire RF power delivery network, including the impedance matching network. Moreover, the invention provides the ability to maintain calibration information local to each respective measurement site and enables the avoidance of frequency-discrimination circuitry and harmonic analysis of prior art methods.

6. COMBINATIONS AND SUB-COMBINATIONS

The devices and methodologies described herein may be used in various combinations and sub-combinations with each other and with components known to the art to arrive at a variety of useful devices. For example, various frequency dependent RF sensors as are known to the art may be used in combination with either or both of the RF voltage and RF current transducers disclosed herein, and or in combination with either or both of the power delivery diagnostic systems and RF sensors disclosed herein. Thus, in particular, various frequency dependent RF sensors as are known to the art may be used in combination with both the RF voltage and RF current transducers disclosed herein. Also, various frequency dependent RF sensors as are known to the art may be used in combination with both the RF voltage and RF current transducers disclosed herein, and further in combination with the power delivery diagnostic systems and RF sensors disclosed herein.

Likewise, the non-frequency dependent RF detectors disclosed herein may be used in combination with either or both of the RF current transducers and RF voltage transducers disclosed herein. For example, the non-frequency dependent RF detectors disclosed herein may be used in combination with both the RF current transducers and the RF voltage transducers disclosed herein. These combinations may further be used in combination with either or both of the RF sensors and power delivery diagnostic systems disclosed herein. For example, the non-frequency dependent RF detectors disclosed herein may be used in combination with both the RF current transducers and RF voltage transducers disclosed herein, and further in combination with the RF sensors and power delivery diagnostic systems disclosed herein.

In addition, the RF sensors disclosed herein may be used in combination with either or both of the RF voltage and RF voltage transducers disclosed herein. For example, the RF sensors disclosed herein may be used in combination with both of the RF frequency and RF voltage transducers disclosed herein.

Although the various devices and methodologies disclosed herein have been described in detail, one skilled in the art will appreciate that various changes, substitutions and alterations can be made hereto without departing from the spirit and scope of the teachings set forth herein.

What is claimed is:

1. An RF detector for use in association with a semiconductor processing system for detecting process parameters during semiconductor plasma processing, comprising:

an AC voltage transducer coupled to a RF power delivery line and associated with said semiconductor processing system for generating RF voltage sample measurements of RF voltages from said RF power delivery line as said RF voltages occur within a semiconductor plasma processing environment of said semiconductor processing system;

an AC current transducer coupled to said RF power delivery line and associated with said semiconductor processing system for generating current signals sample measurements of AC from said RF power delivery line as said current signals occur within said semiconductor plasma processing environment;

said RF detector further separating the signal output from said AC voltage transducer into a DC component and an RF component, said DC component for generating a DC voltage parameter and said RF component of the signal for generating an RF voltage parameter, and further comprising an RF current detector for generating an RF current output;

a phase detector for outputting a phase angle of the RF current output relative to the RF voltage parameter;

said RF detector formed in a single integrated unit and further comprising means for coupling to an RF power delivery line between an RF power delivery network and a plasma RF load within said semiconductor plasma processing environment.

2. The RF detector of claim 1, wherein said RF detector further comprises a memory unit within said single integrated unit for storing calibration information relating to said AC voltage transducer, said AC current transducer, and said phase detector, thereby enabling said RF detector to operate as a single integrated unit.

3. The RF detector of claim 1, wherein said RF detector operates independent of the frequency of said RF power from said RF power delivery network.

4. The RF detector of claim 1, further comprising circuitry for operation in association with said AC voltage transducer and said AC current transducer for determining the proper operation of an RF power delivery network by sensing operating parameters before said RF power reaches a predetermined load portion of an impedence matching circuit associated with said RF power delivery network.

5. The RF detector of claim 1, wherein said predetermined load portion of an impedence matching circuit comprises a 50 ohm impedance matching circuit.

6. The RF detector of claim 1, further comprising circuitry for operation in association with said AC voltage transducer and said AC current transducer for determining the proper operation of an RF power delivery network by sensing operating parameters after said RF power reaches a predetermined load portion of an impedence matching circuit.

7. The RF detector of claim 1, further comprising circuitry for operation in association with said AC voltage transducer and said AC current transducer for determining the input impedance from an impedance matching network to said plasma RF load within said semiconductor processing environment.

8. The RF detector of claim 1, further comprising circuitry for operation in association with said AC voltage transducer and said AC current transducer for determining power transfer efficiency from said RF power delivery network to said plasma RF load within said semiconductor plasma processing environment.

9. A method for use in association with a semiconductor processing system for detecting plasma process parameters during semiconductor plasma processing, comprising:

generating RF voltage sample measurements of RF voltages from a RF power delivery line as said RF voltages occur within a semiconductor plasma processing environment of said semiconductor processing system using a AC voltage transducer coupled to said RF power delivery line and associated with said semiconductor processing system;

generating current signals sample measurements of AC from said RF power delivery line as said current signals occur within said semiconductor plasma processing environment using an AC current transducer coupled to said RF power delivery line and associated with said semiconductor plasma processing system;

separating the signal output from said AC voltage transducer into a DC component and an RF component, said DC component for generating a DC voltage parameter and said RF component of the signal for generating an RF voltage paramenter, and generating an RF current output using an RF current detector of said RF detector;

outputting a phase angle of the RF current output relative to the RF voltage parameter using a phase detector within said RF detector; and coupling said RF detector as a single integrated unit to an RF power delivery line between an RF power delivery network and a plasma RF load within said semiconductor plasma processing environment.

10. The method of claim 9, further comprising the step of storing calibration information relating to said AC voltage transducer, said AC current transducer, and said phase detector in a memory unit within said single integrated unit for, thereby enabling said RF detector to operate as a single integrated unit.

11. The method of claim 9, further comprising the step of operating said RF detector independent of the frequency of said RF power from said RF power delivery network.

12. The method of claim 9, further comprising the step of operating said RF detector with said AC voltage transducer and said AC current transducer for determining the proper operation of an RF power delivery network by sensing operating parameters before said RF power reaches a predetermined load portion of an impedance matching circuit associated with said RF power delivery network.

13. The method of claim 9, wherein said predetermined load portion of an impedance matching circuit comprises a 50 ohm impedance matching circuit.

14. The method of claim 9, further comprising determining the proper operation of an RF power delivery network by sensing operating parameters after said RF power reaches a predetermined load portion of an impedance matching circuit.

15. The method of claim 9, further comprising the step of determining the input impedance from an impedance matching network to said plasma RF load within said semiconductor plasma processing environment.

16. The method of claim 9, further comprising the step of determining power transfer efficiency from said RF power delivery network to said plasma RF load within said semiconductor plasma processing environment.

* * * * *